(12) United States Patent
Nagasaki et al.

(10) Patent No.: US 9,142,733 B2
(45) Date of Patent: Sep. 22, 2015

(54) LIGHT SOURCE DEVICE INCLUDING A HIGH ENERGY LIGHT SOURCE AND A WAVELENGTH CONVERSION MEMBER, ILLUMINATING DEVICE COMPRISING THE SAME, AND VEHICLE

(71) Applicant: Panasonic Corporation, Osaka (JP)

(72) Inventors: Yoshihisa Nagasaki, Osaka (JP); Takashi Ohbayashi, Osaka (JP); Osamu Inoue, Osaka (JP); Kojiro Okuyama, Nara (JP); Mitsuru Nitta, Osaka (JP); Seigo Shiraishi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/335,506

(22) Filed: Jul. 18, 2014

(65) Prior Publication Data

US 2015/0060916 A1     Mar. 5, 2015

(30) Foreign Application Priority Data

Sep. 3, 2013   (JP) ................. 2013-182269

(51) Int. Cl.
*H01L 33/00*   (2010.01)
*H01L 33/50*   (2010.01)
(Continued)

(52) U.S. Cl.
CPC ............. *H01L 33/504* (2013.01); *F21S 48/115* (2013.01); *F21S 48/1145* (2013.01); *H01L 33/50* (2013.01);
(Continued)

(58) Field of Classification Search
USPC ........................................... 257/98, 99, 100
See application file for complete search history.

(56) References Cited

U.S. PATENT DOCUMENTS 7,165,871 B2 *  1/2007  Takeda et al. ................. 362/538
2007/0278935 A1 * 12/2007  Harada ......................... 313/503
(Continued)

FOREIGN PATENT DOCUMENTS

EP          2426745        3/2012
JP          2005-008843    1/2005
(Continued)

OTHER PUBLICATIONS

Luminescent and structural properties, 2009. Radiation induced valence changes in Eu-doped phosphors, 1997. Light source, 2005.*
(Continued)

*Primary Examiner* — Bilkis Jahan
(74) *Attorney, Agent, or Firm* — McDermott Will & Emery LLP

(57) ABSTRACT

A light source device is provided. The light source device comprises a semiconductor light-emitting element; and a wavelength conversion member for converting a wavelength of a light emitted from the semiconductor light-emitting element. The semiconductor light-emitting element has a light-emitting peak wavelength of not less than 380 nanometers and not more than 420 nanometers. The light emitted from the semiconductor light-emitting element has a light energy density of not less than 0.2 kW/cm$^2$. The wavelength conversion member contains at least one fluorescent substance selected from the group consisting of a $(Sr_{1-x},Ba_x)_3MgSi_2O_8:Eu^{2+}$ ($0 \leq x \leq 1$) fluorescent substance, a $(Y_{1-y},Gd_y)_3(Al_{1-z},Ga_z)_5O_{12}:Ce^{3+}$ ($0 \leq y \leq 1$, $0 \leq z \leq 1$) fluorescent substance, and an $Eu^{3+}$-activated fluorescent substance. The light source device has a high output and a high light-emitting efficiency.

12 Claims, 9 Drawing Sheets

(51) Int. Cl.
*F21S 8/10* (2006.01)
*H01S 5/343* (2006.01)
*C09K 11/77* (2006.01)
*F21Y 101/02* (2006.01)

(52) U.S. Cl.
CPC ......... *H01S 5/34333* (2013.01); *C09K 11/7721* (2013.01); *C09K 11/7734* (2013.01); *C09K 11/7736* (2013.01); *C09K 11/7774* (2013.01); *C09K 11/7794* (2013.01); *F21Y 2101/025* (2013.01); *H01L 33/502* (2013.01); *H01L 33/507* (2013.01)

(56) References Cited

U.S. PATENT DOCUMENTS

| | | | |
|---|---|---|---|
| 2011/0044069 A1* | 2/2011 | Sato et al. | 362/551 |
| 2011/0096560 A1* | 4/2011 | Ryu et al. | 362/510 |
| 2011/0280032 A1 | 11/2011 | Kishimoto | |
| 2012/0008647 A1 | 1/2012 | Matsuda et al. | |
| 2013/0069520 A1* | 3/2013 | Nagasaki et al. | 313/486 |
| 2014/0003074 A1 | 1/2014 | Kishimoto | |
| 2014/0285997 A1 | 9/2014 | Nitta et al. | |
| 2015/0002824 A1* | 1/2015 | Kasugai et al. | 353/31 |

FOREIGN PATENT DOCUMENTS

| | | |
|---|---|---|
| JP | 2005-150041 | 6/2005 |
| JP | 2006-041096 | 2/2006 |
| JP | 2006-348262 | 12/2006 |
| WO | 2012/124587 | 9/2012 |
| WO | 2014/080562 | 5/2014 |

OTHER PUBLICATIONS

The Extended European Search Report dated Oct. 27, 2014 for the related European Patent Application No. 14180117.5.

Kiyoshi Morimoto et al.: "A 30 W Pure Blue Emission with NUV Laser-Diode-Pumped Phosphor for High-Brightness Projectors", SID International Symposium, Digest of Technical Papers, Wiley-Blackwell Publishing, Inc, US, vol. 44, No. 1, Jul. 1, 2013, pp. 832-835, XP008172392, ISSN: 0097-966X, DOI: 10.1002/J.2168-0159. 2013:TB06346.X.

* cited by examiner

LIGHT SOURCE DEVICE INCLUDING A HIGH ENERGY LIGHT SOURCE AND A WAVELENGTH CONVERSION MEMBER, ILLUMINATING DEVICE COMPRISING THE SAME, AND VEHICLE

BACKGROUND

1. Technical Field

The present invention relates to a light source device including a semiconductor light-emitting element (especially, a laser diode) and a wave conversion member for converting a wavelength of a light emitted from the semiconductor light-emitting element. The present invention also relates to an illuminating device (especially, an illuminating device for vehicles) comprising the light source device. The present invention further relates to a vehicle comprising such an illuminating device for vehicles.

2. Description of the Related Art

Recently, a light source device comprising a semiconductor light emitting element and a wave conversion member has been developed. Such a light source device is used in various kinds of illuminating devices. Among others, a high-output light source device is useful for an illuminating device for vehicles (e.g., a headlight). As just described, a high-output light source device has been developed.

U.S. Pat. No. 7,165,871 discloses a lamp for generating light comprising a semiconductor light-emitting element for emitting light, a fluorescent substance provided away from the semiconductor light-emitting element, a first optical member operable to focus the light generated by the semiconductor light-emitting element on the fluorescent substance, and a second optical member having an optical center at a position where the fluorescent substance is provided and operable to emit light from the fluorescent substance based on the light focused by the first optical member to an outside of the lamp. In U.S. Pat. No. 7,165,871, a laser diode generating ultraviolet light is used as the semiconductor light emitting element. U.S. Pat. No. 7,165,871 discloses that the lamp is used for a headlamp of a vehicle.

SUMMARY

The present invention provides a light source device comprising:
 a semiconductor light-emitting element; and
 a wavelength conversion member for converting a wavelength of a light emitted from the semiconductor light-emitting element into a longer wavelength,
 wherein
 the semiconductor light-emitting element has a light-emitting peak wavelength of not less than 380 nanometers and not more than 420 nanometers;
 the light emitted from the semiconductor light-emitting element has a light energy density of not less than 0.2 kW/cm$^2$; and
 the wavelength conversion member contains at least one fluorescent substance selected from the group consisting of a $(Sr_{1-x},Ba_x)_3MgSi_2O_8:Eu^{2+}$ (0≤x≤1) fluorescent substance, a $(Y_{1-y},Gd_y)_3(Al_{1-z},Ga_z)_5O_{12}:Ce^{3+}$ (0≤y<1, 0≤z<1) fluorescent substance, and an $Eu^{3+}$-activated fluorescent substance.

In the present invention, improved is light-emitting efficiency of the light source device using the semiconductor light-emitting element emitting a light having a high energy density.

DETAILED DESCRIPTION OF THE EMBODIMENTS

Hereinafter, the present invention is described in more detail with reference to the drawings.

First Embodiment

Figure 1:
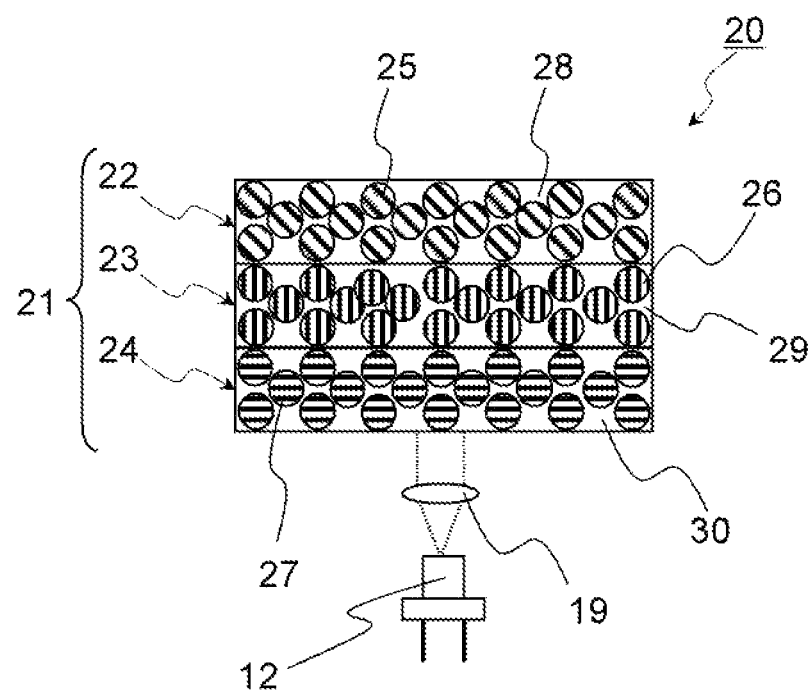
FIG. 1 shows a schematic view of the light source device according to the first embodiment.

FIG. 1 shows a schematic view of a light source device 20 according to the first embodiment. The light source device 20 comprises a wavelength conversion member 21 and a semiconductor light-emitting element 12.

The semiconductor light-emitting element 12 emits a blue-violet light. In the instant specification, "blue-violet light" means a light having a peak wavelength of not less than 380 nanometers and not more than 420 nanometers. The semiconductor light-emitting element 12 emitting a blue-violet light has higher light-emitting efficiency than a semiconductor light-emitting element emitting an ultraviolet light. In a case where the semiconductor light-emitting element 12 emitting a blue-violet light has a light-emitting peak wavelength of 405 nanometers, the semiconductor light-emitting element 12 emitting a blue-violet light has the highest light-emitting efficiency. Therefore, the semiconductor light-emitting element 12 may have a light-emitting peak wavelength of not less than 385 nanometers, desirably, not less than 390 nanometers. On the other hand, the semiconductor light-emitting element 12 may have a light-emitting peak wavelength of not more than 415 nanometers, desirably, not more than 410 nanometers.

The light emitted from the semiconductor light-emitting element 12 has a light energy density of not less than 0.2 kW/cm$^2$. In case where the light emitted from the semiconductor light-emitting element 12 has a light energy density less than 0.2 kW/cm$^2$, it is difficult to configure a high-output light source device. The light emitted from the semiconductor light-emitting element 12 may have a light energy density of not less than 0.3 kW/cm$^2$, desirably not less than 0.5 kW/cm$^2$, more desirably not less than 1.0 kW/cm$^2$. On the other hand, too high energy density of the light emitted from the semiconductor light-emitting element 12 may have adverse effects on the light source device due to the increase in the amount of the heat generation in a fluorescent substance contained in the wavelength conversion member 21. For this reason, the light emitted from the semiconductor light-emitting element 12 has a light energy density of not more than 3.5 kW/cm$^2$, desirably not more than 3 kW/cm$^2$, more desirably not more than 2.5 kW/cm$^2$, still more desirably not more than 2 kW/cm$^2$.

As long as the light emitted from the semiconductor light-emitting element 12 has a light energy density of not less than 0.2 kW/cm$^2$, the semiconductor light-emitting element 12 is not limited. An example of the semiconductor light-emitting element 12 is a laser diode. The semiconductor light-emitting element 12 may be formed of one laser diode. Alternatively, the semiconductor light-emitting element 12 may be formed of a plurality of laser diodes which have been optically coupled. For example, the semiconductor light-emitting element 12 comprises a light-emitting layer formed of nitride semiconductor layers each having a growth surface of a non-polar or semi-polar surface.

In the first embodiment, the case will be described where the semiconductor light-emitting element 12 is a laser diode emitting a light having a wavelength of 405 nanometers.

The wavelength conversion member 21 converts the light emitted from the semiconductor light-emitting element 12 into a light having a longer wavelength. The wavelength conversion member 21 contains at least one fluorescent substance selected from the group consisting of a $(Sr_{1-x},Ba_x)_3MgSi_2O_8:Eu^{2+}$ (0≤x≤1) fluorescent substance, a $(Y_{1-y},Gd_y)_3(Al_{1-z},Ga_z)_5O_{12}:Ce^{3+}$ (0≤y<1, 0≤z<1) fluorescent substance, and an $Eu^{3+}$-activated fluorescent substance. Such a fluorescent substance converts the light emitted from the semiconductor light-emitting element 12 into a light having a longer wavelength.

The $(Sr_{1-x},Ba_x)_3MgSi_2O_8:Eu^{2+}$ (0≤x≤1) fluorescent substance, the $(Y_{1-y},Gd_y)_3(Al_{1-z},Ga_z)_5O_{12}:Ce^{3+}$ (0≤y<1, 0≤z<1) fluorescent substance, and the $Eu^{3+}$-activated fluorescent substance convert the light into a light having a longer wavelength at high efficiency, even if the exciting light, namely, the light emitted from the semiconductor light-emitting element 12, has a high energy density. Accordingly, such a fluorescent substance allows the light-emitting efficiency of the light source device to be raised, even if the semiconductor light-emitting element emitting a light having a high energy density is used. Such a combination of the fluorescent substance and the semiconductor light-emitting element 12 having a light-emitting peak wavelength of not less than 380 nanometers and not more than 420 nanometers allows the light-emitting efficiency of the light source device to be raised.

If the fluorescent substance contains at least two kinds selected from the group consisting of the $(Sr_{1-x},Ba_x)_3MgSi_2O_8:Eu^{2+}$ (0≤x≤1) fluorescent substance, the $(Y_{1-y},Gd_y)_3(Al_{1-z},Ga_z)_5O_{12}:Ce^{3+}$ (0≤y<1, 0≤z<1) fluorescent substance, and the $Eu^{3+}$-activated fluorescent substance, more advantageous light-emitting efficiency is achieved.

An example of the $Eu^{3+}$-activated fluorescent substance is a $LiLaW_2O_8:Eu^{3+}$ fluorescent substance, a $Ca_2W_2O_8:Eu^{3+}$ fluorescent substance, or a $LiGdW_2O_8:Eu^{3+}$ fluorescent substance. These fluorescent substances may be used alone or in combination with one another. These fluorescent substances have significantly high light-emitting efficiency. These fluorescent substances have significantly high light-emitting efficiency with regard to the exciting light having a wavelength of not less than 395 nanometers and not more than 405 nanometers.

The above-mentioned fluorescent substances may be fabricated in accordance with known methods.

The wavelength conversion member may be one layer of a wavelength conversion layer where plural kinds of fluorescent substances have been mixed. Alternatively, the wavelength conversion member may have a stacking structure composed of two or more wavelength conversion layers each containing one kind or two kinds of fluorescent substance(s).

In the first embodiment, the case will be described where a stacking structure composed of three wavelength conversion layers is used as the wavelength conversion member 21. This stacking structure has a first fluorescent substance layer 22 containing the $(Sr_{1-x},Ba_x)_3MgSi_2O_8:Eu^{2+}$ (0≤x≤1) fluorescent substance, a second fluorescent substance layer 23 containing the $(Y_{1-y},Gd_y)_3(Al_{1-z},Ga_z)_5O_{12}:Ce^{3+}$ (0≤y<1, 0≤z<1) fluorescent substance, and the third fluorescent substance layer 24 containing the $LiGdW_2O_8:Eu^+$-activated fluorescent substance. The first fluorescent substance layer 22, the second fluorescent substance layer 23, and the third fluorescent substance layer 24 contain a plurality of first fluorescent substance particles 25, a plurality of second fluorescent substance particles 26, and a plurality of third fluorescent substance particles 27, respectively. The first fluorescent substance layer 22, the second fluorescent substance layer 23, and the third fluorescent substance layer 24 may contain a first binder 28, a second binder 29, and a third binder 30, respectively. An example of the material of the first binder 28, the second binder 29, and the third binder 30 is resin, glass, or transparent crystal. The materials of the first binder 28, the second binder 29, and the third binder 30 may be the same as or different from one another. Each of the first fluorescent substance layer 22, the second fluorescent substance layer 23, and the third fluorescent substance layer 24 may be composed only of the fluorescent particles.

An incident optical system 19 for leading the light emitted from the semiconductor light-emitting element 12 to the third fluorescent substance layer 24 may be provided between the wavelength conversion member 21 and the semiconductor light-emitting element 12. For example, the incident optical system 19 comprises a lens, a mirror and/or an optical fiber.

Next, the operation of the light source device 20 will be described. The blue-violet light emitted from the semiconductor light-emitting element 12 is incident on the third fluorescent substance layer 24 through the incident optical system 19. This incident light excites the plurality of the third fluorescent substance particles 27 contained in the third fluorescent substance layer 24 to emit a red light. Then, a part of the blue-violet light which has travelled through the third fluorescent substance layer 24 without being absorbed by the third fluorescent substance layer 24 is incident on the second fluorescent substance layer 23. This incident light excites the plurality of the second fluorescent substance particles 26 contained in the second fluorescent substance layer 23 to emit a green light. Furthermore, a part of the blue-violet light which has travelled through the second fluorescent substance layer 23 without being absorbed by the second fluorescent substance layer 23 is incident on the first fluorescent substance layer 22. This incident light excites the plurality of the first fluorescent substance particles 25 contained in the first fluorescent substance layer 22 to emit a blue light. These red light, green light, and blue light are mixed to be a white light.

Color rendering properties is improved, if the wavelength conversion member contains a blue fluorescent substance, a green fluorescent substance, and a red fluorescent substance. Even when the emitting light (namely, the exciting light) has a higher energy density, all of the blue, green, and red fluorescent substances convert the light into a light having a longer wavelength at high efficiency in a case where the wavelength conversion member contains the $(Sr_{1-x},Ba_x)_3MgSi_2O_8:Eu^{2+}$ ($0 \leq x \leq 1$) fluorescent substance as the blue fluorescent substance, the $(Y_{1-y},Gd_y)_3(Al_{1-z},Ga_z)_5O_{12}:Ce^{3+}$ ($0 \leq y<1$, $0 \leq z<1$) fluorescent substance as the green fluorescent substance, and the $Eu^{3+}$-activated fluorescent substance as the red fluorescent substance. For this reason, both the color rendering property and the light-emitting efficiency of the light source device are improved.

The thicknesses of the first fluorescent substance layer 22, the second fluorescent substance layer 23, and the third fluorescent substance layer 24 may be adjusted such that the blue-violet light emitted from the semiconductor light-emitting element 12 does not penetrate the first fluorescent substances 22. The thicknesses of the first fluorescent substance layer 22, the second fluorescent substance layer 23, and the third fluorescent substance layer 24 may be adjusted such that the blue-violet light penetrates the first fluorescent substances 22, and the light source device may be provided with an absorption layer for absorbing the penetrated blue-violet light or with a reflection layer for reflecting the penetrated blue-violet light. Since the light itself emitted from the semiconductor light-emitting element 12 is not indispensable as a component element of a white light, the absorption layer or the reflection layer allows a coherent laser light emitted from the semiconductor light-emitting element 12 to be prevented from being emitted to the outside of the light source device, the safety of the light source device 20 is improved.

The light source device according to the first embodiment may be used for a light source of, for example, a typical illuminating device such as a ceiling light; a special illuminating device such as a spotlight, an illumination for stadiums, or an illumination for studios; an illumination device for vehicles such as a headlamp; a projection device such as a projector or a head-up display; light for endoscopes; an imaging device such as a digital camera, a cellular phone, a smartphone; or a liquid crystal display device such as a monitor for personal computers, a notebook personal computer, a television, a personal digital assistant (PDA), a smartphone, a tablet personal computer, or a cellar phone.

A light emitted from a laser diode has a higher energy density than a light emitted from a light-emitting diode (hereinafter referred to as "LED"), which has been conventionally used as a semiconductor light-emitting element. Various fluorescent substances are known. The present inventors discovered a problem that the light-emitting efficiency of the fluorescent substance used conventionally is decreased with an increase in the energy density of the exciting light. This problem causes a problem that the light-emitting efficiency is decreased in the light source device where the semiconductor light-emitting element emitting a light (namely, an exciting light) having a high energy density is used together with a fluorescent substance used conventionally. The light-emitting source 20 according to the first embodiment solves these problems.

Second Embodiment

Figure 2:
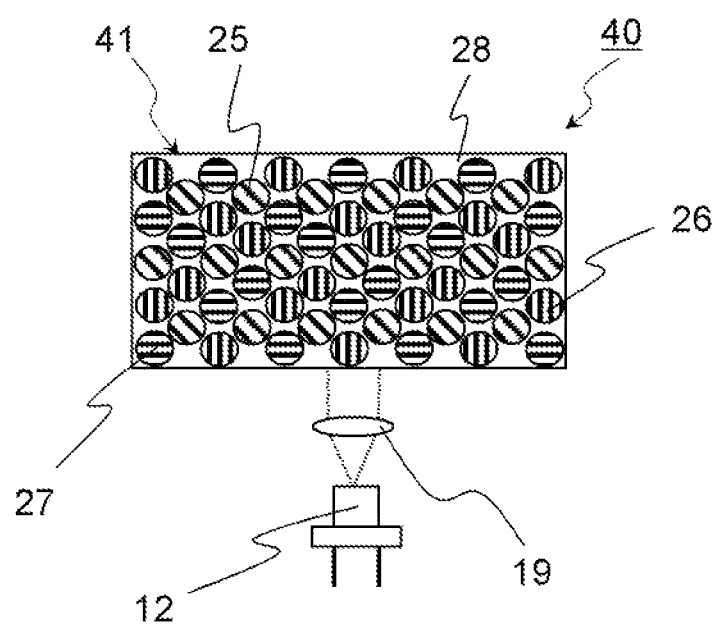
FIG. 2 shows a schematic view of the light source device according to the second embodiment.

FIG. 2 shows a schematic view of a light source device 40 according to the second embodiment. The light source device 40 according to the second embodiment comprises a wavelength conversion member 41 and the semiconductor light-emitting element 12.

The wavelength conversion member 41 includes a fluorescent substance. The fluorescent substance converts the light emitted from the semiconductor light-emitting element 12 into a light having a longer wavelength. The wavelength conversion member 41 has a wavelength conversion layer in which at least two kinds of the fluorescent substances selected from the group consisting of the $(Sr_{1-x},Ba_x)_3MgSi_2O_8:Eu^{2+}$ ($0 \leq x \leq 1$) fluorescent substance, the $(Y_{1-y},Gd_y)_3(Al_{1-z},Ga_z)_5O_{12}:Ce^{3+}$ ($0 \leq y<1$, $0 \leq z<1$) fluorescent substance, and the $Eu^{3+}$-activated fluorescent substance. In the second embodiment, the case will be described where the wavelength conversion member 41 is formed by mixing three kinds of the fluorescent substances of the $(Sr_{1-x},Ba_x)_3MgSi_2O_8:Eu^{2+}$ ($0 \leq x \leq 1$) fluorescent substance, the $(Y_{1-y},Gd_y)_3(Al_{1-z},Ga_z)_5O_{12}:Ce^{3+}$ ($0 \leq y<1$, $0 \leq z<1$) fluorescent substance, and the $LiLaW_2O_8:Eu^{3+}$-activated fluorescent substance. The mixing ratio of the three kinds of the fluorescent substances may be appropriately adjusted in accordance with a desired white chromaticity. The wavelength conversion member 41 may contain the binder 28. An example of the material of the binder 28 is resin, glass or, transparent crystal. The binder 28 may be composed of single material. Alternatively, the binder 28 may be composed of at least two kinds of materials. The fluorescent substance layer which is the wavelength conversion member 41 may be composed only of fluorescent particles.

The wavelength conversion member 41 is irradiated with the blue-violet light emitted from the semiconductor light-emitting element 12 and travelled through the incident optical system 19. The blue-violet light is converted into a blue light, a green light, a red light by the blue fluorescent substance 25, the green fluorescent substance 26, and red fluorescent substance 27 contained in the wavelength conversion member 41, respectively. These three color lights are mixed to be a white light. Also in the second embodiment, both the color rendering property and the light-emitting efficiency of the light source device are improved similarly to the case of the first embodiment.

The thickness of the wavelength conversion member 41 may be adjusted such that the blue-violet light emitted from the semiconductor light-emitting element 12 does not penetrate the wavelength conversion member 41. The thickness of the wavelength conversion member 41 may be adjusted such that the blue-violet light penetrates the wavelength conversion member 41, and the light source device may be provided with an absorption layer for absorbing the penetrated blue-violet light or with a reflection layer for reflecting the penetrated blue-violet light. Similarly to the case of the first embodiment, the absorption layer or the reflection layer allows the safety of the light source device to be improved.

The light source device 40 according to the second embodiment may be used for the same purpose as that of the light source device 20 according to the first embodiment.

Third Embodiment

The illuminating device according to the third embodiment comprises the light source device according to the first or second embodiment. An example of the illuminating device is a typical illuminating device such as a ceiling light; a special illuminating device such as a spotlight, an illumination for stadiums, or an illumination for studios; an illumination device for vehicles such as a headlamp. It is beneficial to use the illuminating device as an illuminating device of which high illuminance intensity is required (for example, a special illumination device or an illumination device for vehicle). The term "vehicle" used in the present specification means a car, a rail car, a streetcar, a two-wheeled vehicle (e.g., a motorcycle), or a special vehicle (e.g., a building vehicle or an agriculture vehicle).

As one example, the case will be described where the illumination device according to the third embodiment is used as an illumination device for vehicles (e.g., a headlamp).

Figure 3:
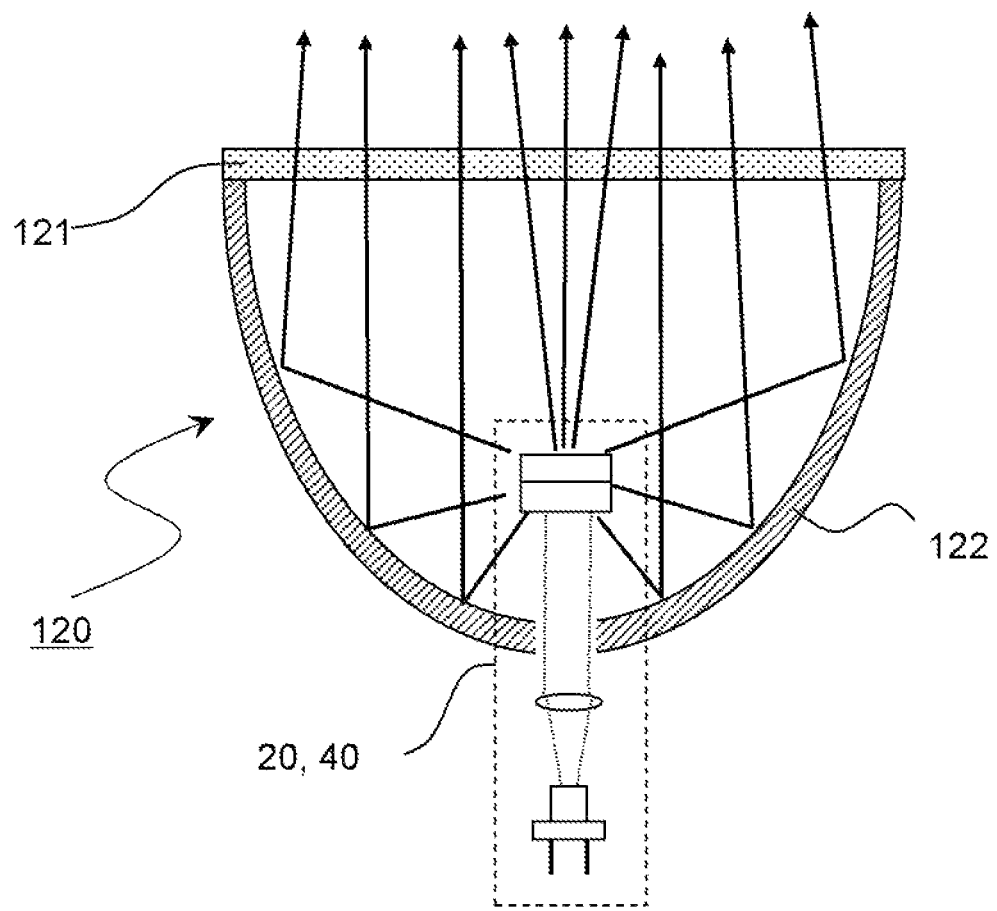
FIG. 3 shows a schematic view of the illuminating device (the headlamp for vehicles) according to the third embodiment.

FIG. 3 shows a schematic view of a vehicle headlamp 120 according to the third embodiment. The vehicle headlamp 120 according to the third embodiment comprises the light source device 20 according to the first embodiment or the light source device 40 according to the second embodiment and a light-emitting optical system 122 for leading ahead the light emitted from the light source device. In order to prevent the blue-violet emitted from the semiconductor light-emitting element included in the light source device from being emitted to the outside of the headlamp 120, a wavelength cut filter 121 for absorbing or reflecting the blue-violet light may be provided. An example of the light-emitting optical system 122 is a reflector. The light-emitting optical system 122 has a metal film formed of Al or Ag on the inside surface thereof. A protective film may be formed on the metal film. The vehicle headlamp 120 may be a reflector-type vehicle headlamp or a projector-type vehicle headlamp.

The illuminating device according to the third embodiment has high output and high light-emitting efficiency.

Fourth Embodiment

The vehicle according to the fourth embodiment comprises the illuminating device according to the third embodiment as an illuminating device for vehicles. The vehicle may be an engine vehicle, an electric vehicle, or a hybrid vehicle.

Figure 4:
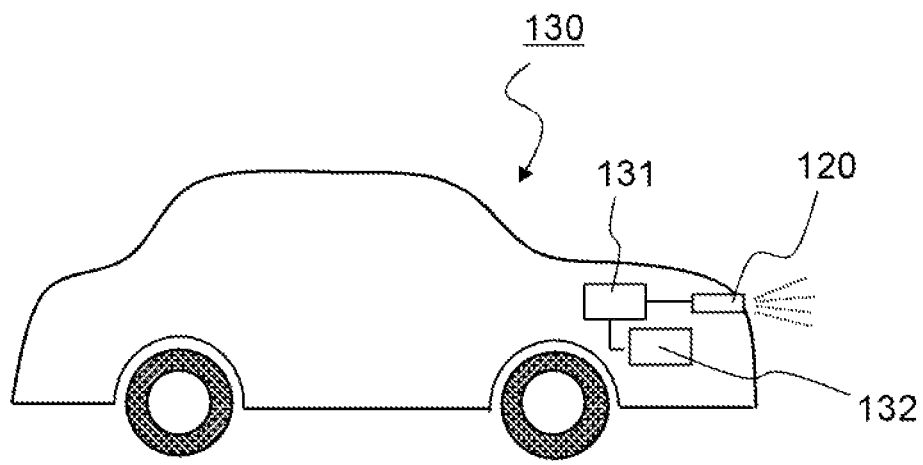
FIG. 4 is a schematic view of the vehicle according to the fourth embodiment.

FIG. 4 shows a schematic view of a vehicle 130 according to the fourth embodiment. The vehicle 130 comprises the vehicle headlamp 120 according to the third embodiment and an electric power supply source 131. The vehicle 130 may have an electric power generator 132 which generates an electric power by being driven by a driving source such as an engine. The electric power generated by the electric power generator 132 is stored in the electric power supply source 131. An example of the electric power supply source 131 is a rechargeable battery. The vehicle headlamp 120 is maintained on by the electric power supplied from the electric power supply source 131.

The vehicle according to the fourth embodiment comprises an electric lamp having high output and high light-emitting efficiency.

EXAMPLES

Hereinafter, the present invention will be described in more detail with reference to the following inventive examples and comparative examples. The present invention is not limited to the following inventive examples.

In the inventive examples, a $Sr_3MgSi_2O_8:Eu^{2+}$ blue fluorescent substance, a $Y_3(Al_{0.7},Ga_{0.3})_5O_{12}:Ce^{3+}$ green fluorescent substance, and a $LiGdW_2O_8:Eu^{3+}$ red fluorescent substance were used. On the other hand, in the comparative examples, used were a $BaMgAl_{10}O_{17}:Eu^{2+}$ blue fluorescent substance, a $Si_2Al_4O_4N_4:Eu^{2+}$ (β-sialon) green fluorescent substance, and a $CaAlSiN_3:Eu^{2+}$ red fluorescent substance, which are typical blue, green, and red fluorescent substances excited by near-ultraviolet light.

Inventive Example 1 and Comparative Example 1

Light-Emitting Efficiency Property Evaluation in Single Light

Figure 5:
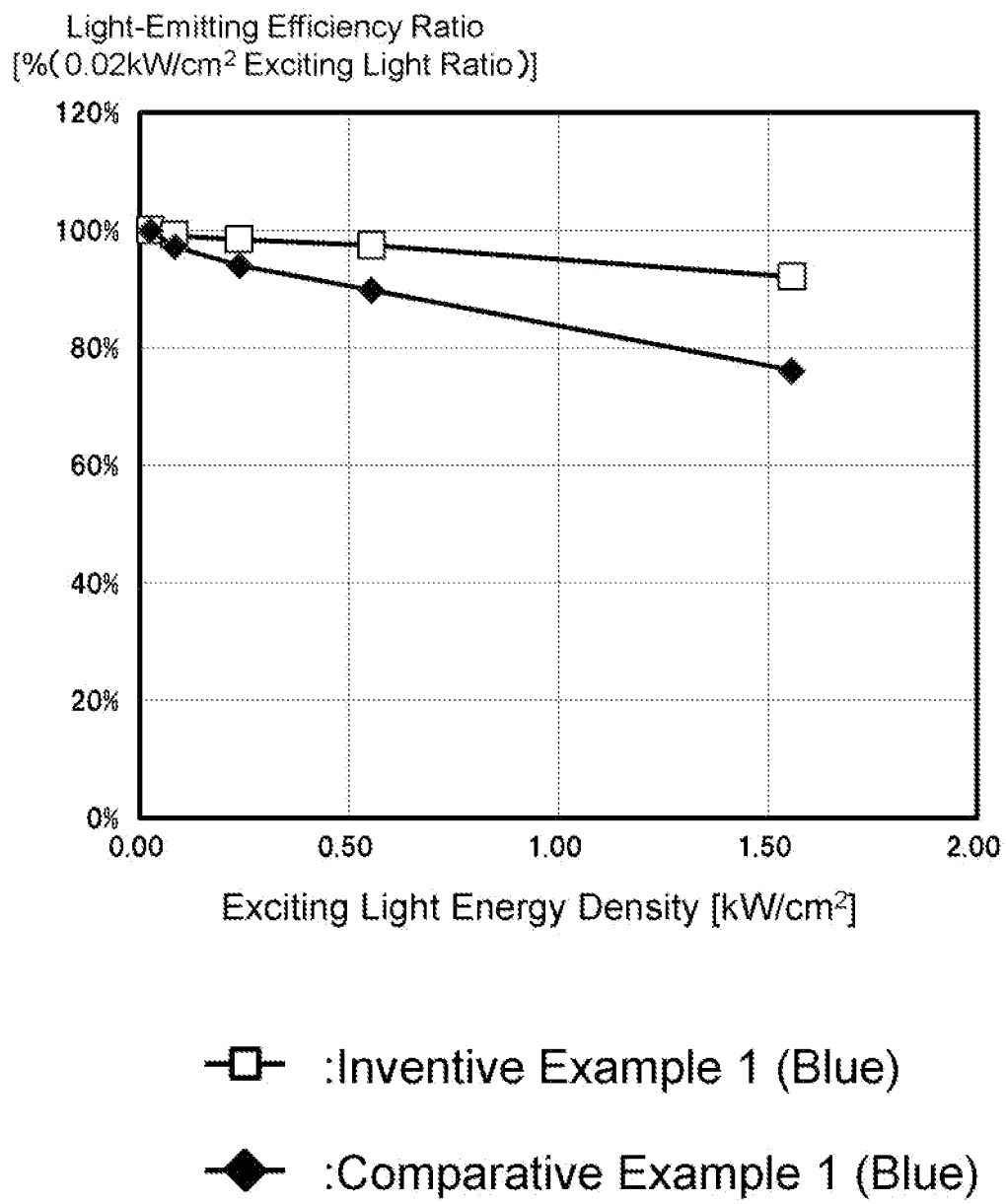
FIG. 5 is a graph showing the exciting light energy density dependency property of the light-emitting efficiency of the blue fluorescent substances according to the inventive example 1 and the comparative example 1.
Figure 6:
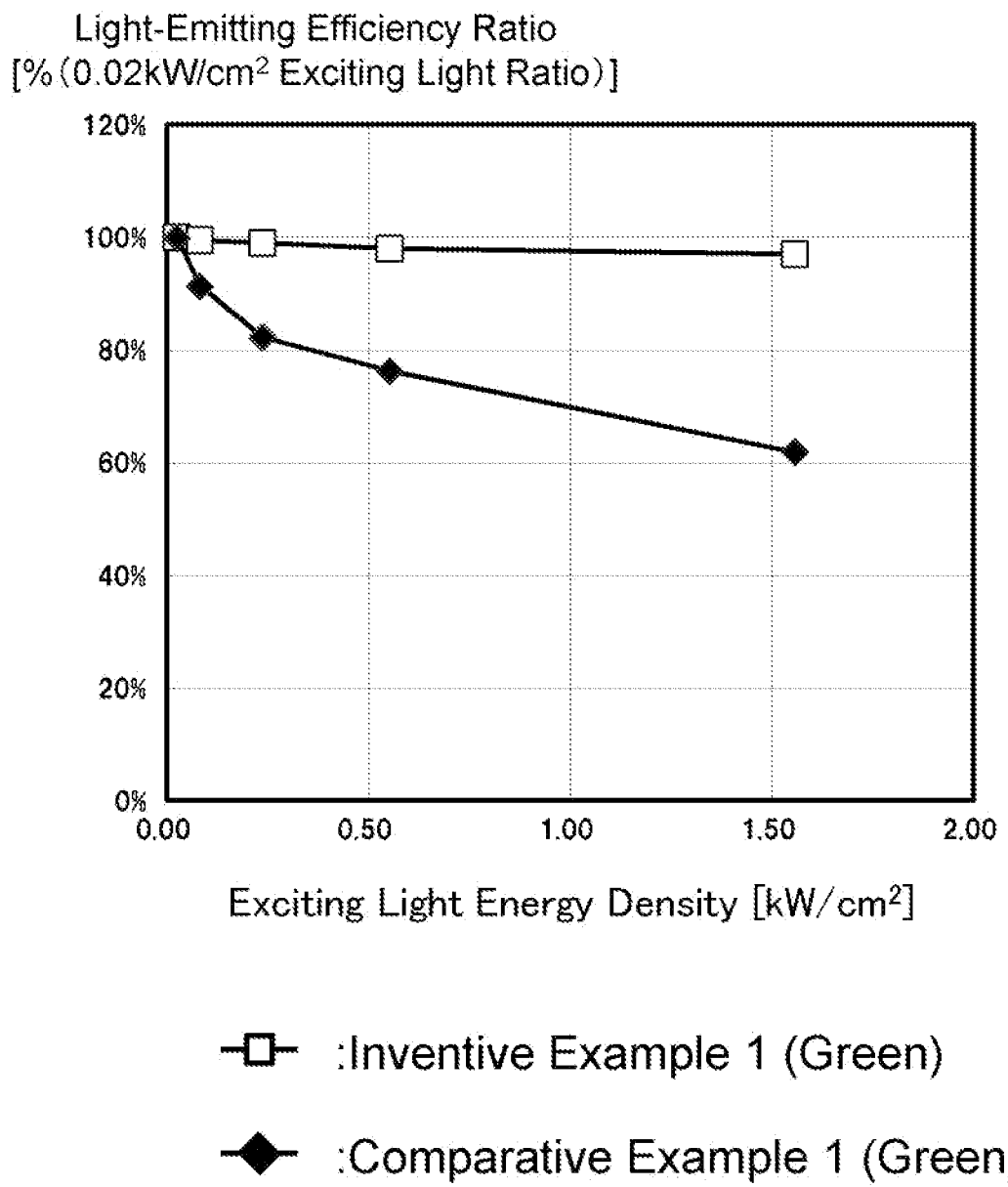
FIG. 6 is a graph showing the exciting light energy density dependency property of the light-emitting efficiency of the green fluorescent substances according to the inventive example 1 and the comparative example 1.
Figure 7:
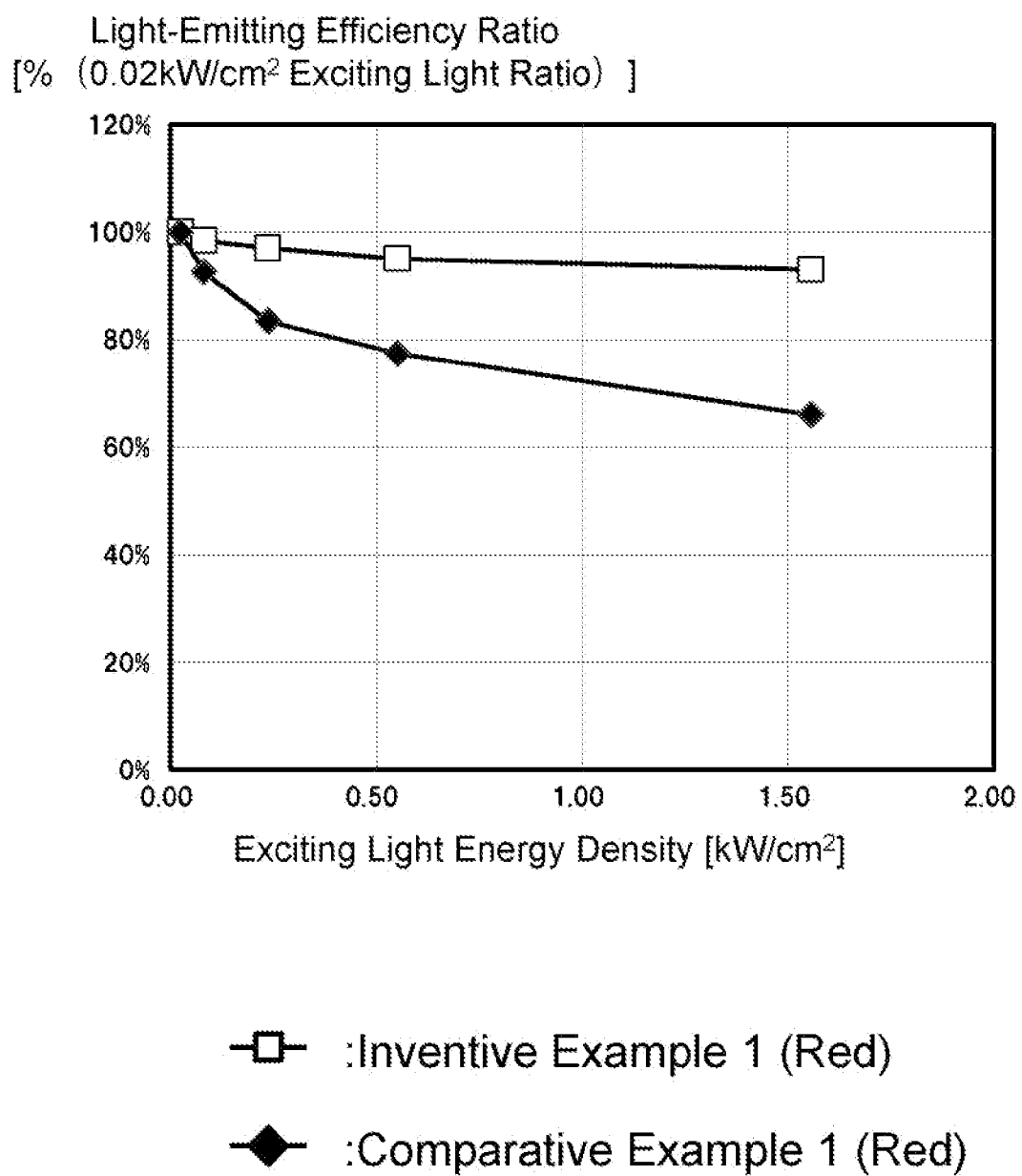
FIG. 7 is a graph showing the exciting light energy density dependency property of the light-emitting efficiency of the red fluorescent substances according to the inventive example 1 and the comparative example 1.

Each of the fluorescent substances of the inventive example and the comparative example was formed so as to have a shape of a layer. A laser diode having a light-emitting peak wavelength of 405 nanometers was used as a semiconductor light-emitting element to irradiate each of the fluorescent substances with the laser light. A light of which a wavelength was converted by the fluorescent substance entered an integrating sphere to measure the light-emitting efficiency with a multi-channel spectroscope (product of Labsphere Inc., available from Ocean Photonics, trade name: USB2000). While the output of the laser diode was controlled, the light-emitting efficiency was measured when each of the fluorescent substances was excited at the light energy density of 0.02 kW/cm², 0.08 kW/cm², 0.24 W/cm², 0.55 kW/cm², and 1.56 kW/cm². Table 1 shows the results thereof. The values included in Table 1 are relative values each calculated by dividing the measured light-emitting efficiency by the light-emitting efficiency measured when the fluorescent substance was excited at a light energy density of 0.02 kW/cm². FIG. 5, FIG. 6, and FIG. 7 are plots of the exciting light energy density vs. the light-emitting efficiency ratio of the blue, green, and red fluorescent substances stated in Table 1, respectively.

TABLE 1

|  |  |  | Light energy density [kW/cm²] 0.02 | 0.08 | 0.24 | 0.55 | 1.56 |
|---|---|---|---|---|---|---|---|
| Inventive example 1 | Blue | $Sr_3MgSi_2O_8: Eu^{2+}$ | 100% | 99% | 98% | 97% | 92% |
|  | Green | $Y_3(Al_{0.7}, Ga_{0.3})_5O_{12}: Ce^{3+}$ | 100% | 100% | 99% | 98% | 97% |
|  | Red | $LiGdW_2O_8: Eu^{3+}$ | 100% | 98% | 97% | 95% | 93% |
| Comparative example 1 | Blue | $BaMgAl_{10}O_{17}: Eu^{2+}$ | 100% | 97% | 94% | 90% | 76% |
|  | Green | $Si_2Al_4O_4N_4: Eu^{2+}$ | 100% | 91% | 82% | 76% | 62% |
|  | Red | $CaAlSi_2N_3: Eu^{2+}$ | 100% | 92% | 83% | 77% | 66% |

As is clear from Table 1 and FIGS. 5-7, the decrease of the light-emitting efficiency due to the increase in the exciting light energy density is smaller in the inventive example 1 than in the comparative example 1. Even if the exciting light of each of the fluorescent substances in the inventive example 1 has an energy density of not less than 0.2 kW/cm², the high light-emitting efficiency is maintained.

Inventive Example 2 and Comparative Example 2

Evaluation of Light Source Device According to First Embodiment

In the inventive example 2, the light source device similar to the one according to the first embodiment was fabricated using a laser diode having a light-emitting peak wavelength of 405 nanometers and the fluorescent substance according to the inventive example 1. The comparative example 2 was the same as the inventive example 2, except that the fluorescent substance according to the comparative example 1 was used instead of the fluorescent substance according to the inventive example 1. Each of these light source devices had a wavelength conversion member formed of a stacking structure of three fluorescent substance layers. The laser diode was used as the semiconductor light-emitting element.

In the light source device according to the inventive example 2, the wavelength conversion member 21 was formed of a stacking structure of the first fluorescent substance layer 22 containing the $Sr_3MgSi_2O_8:Eu^{2+}$ fluorescent substance, the second fluorescent substance layer 23 containing the $Y_3(Al_{0.7},Ga_{0.3})_5O_{12}:Ce^{3+}$ fluorescent substance, and the third fluorescent substance layer 24 containing the $LiGdW_2O_8:Eu^{3+}$ fluorescent substance. In the light source device according to the comparative example 2, the wavelength conversion member 21 was formed of a stacking structure of the first fluorescent substance layer 22 containing the $BaMgAl_{10}O_7:Eu^{2+}$ fluorescent substance, the second fluorescent substance layer 23 containing the $Si_2Al_4O_4N_4:Eu^{2+}$ (β-sialon) fluorescent substance, and the third fluorescent substance layer 24 containing the $CaAlSiN_3:Eu^{2+}$ fluorescent substance.

Figure 8:
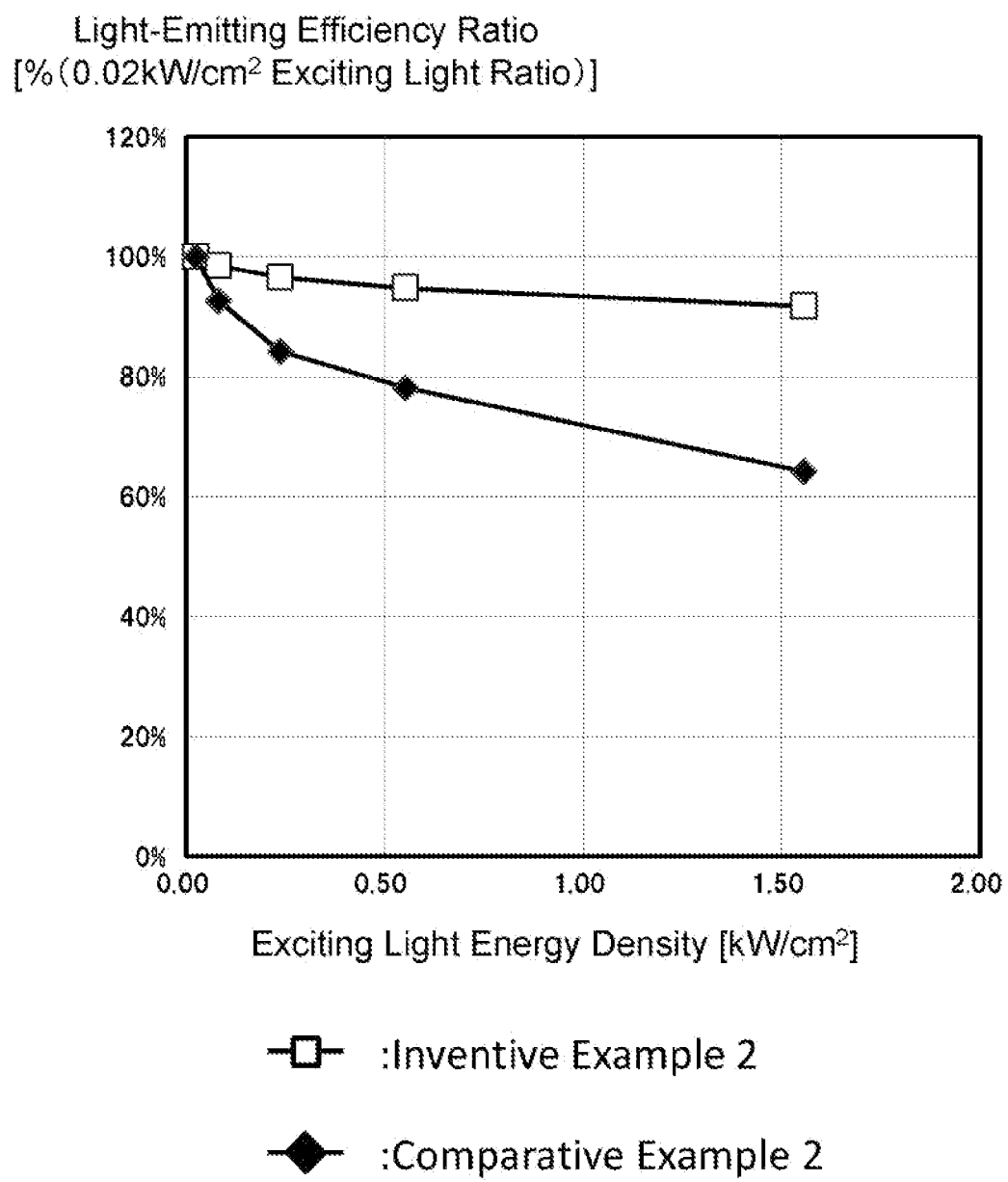
FIG. 8 is a graph showing the exciting light energy density dependency property of the light-emitting efficiency of the light source devices according to the inventive example 2 and the comparative example 2.

While the exciting light energy density incident on the wavelength conversion member 21 was varied by controlling the output of the laser diode, the change of the light-emitting efficiency of the light source devices according to the inventive example 2 and the comparative example 2 was measured. Table 2 shows the result thereof. The values included in Table 2 are relative values each calculated by dividing the measured light-emitting efficiency by the light-emitting efficiency measured when the fluorescent substance was excited at a light energy density of 0.02 kW/cm². FIG. 8 is a plot of the exciting light energy density vs. the light-emitting efficiency ratio stated in Table 2.

TABLE 2

| | Light energy density [kW/cm²] | | | | |
|---|---|---|---|---|---|
| | 0.02 | 0.08 | 0.24 | 0.55 | 1.56 |
| Inventive example 2 | 100% | 98% | 97% | 95% | 92% |
| Comparative example 2 | 100% | 93% | 84% | 78% | 64% |

As is clear from Table 2 and FIG. 8, the decrease of the light-emitting efficiency due to the increase in the exciting light energy density is smaller in the inventive example 2 than in the comparative example 2. Even if the exciting light has an energy density of not less than 0.2 kW/cm², the high light-emitting efficiency is maintained in the light source device according to the inventive example 2.

Inventive Example 3 and Comparative Example 3

Evaluation of Light Source Device According to Second Embodiment

In the inventive example 3, the light source device similar to the one according to the second embodiment was fabricated using a laser diode having a light-emitting peak wavelength of 405 nanometers and the fluorescent substance according to the inventive example 1. The comparative example 3 was the same as the inventive example 2, except that the fluorescent substance according to the comparative example 1 was used instead of the fluorescent substance according to the inventive example 1. Each of these light source devices had a wavelength conversion member having one fluorescent substance layer formed by mixing three kinds of fluorescent substances. The laser diode was used as the semiconductor light-emitting element.

In the inventive example 3, the wavelength conversion member 41 had a fluorescent substance layer formed by mixing three kinds of the fluorescent substances of a $(Sr_{0.2},Ba_{0.8})_3MgSi_2O_8:Eu^{2+}$ fluorescent substance, a $(Y_{0.8},Gd_{0.2})_3(Al_{0.8},Ga_{0.2})_5O_{12}:Ce^{3+}$ fluorescent substance, and a $LiLaW_2O_8:Eu^{3+}$ fluorescent substance. In the comparative example 3, the wavelength conversion member 41 had a fluorescent substance layer formed by mixing three kinds of the fluorescent substances of the $BaMgAl_{10}O_{17}:Eu^{2+}$ fluorescent substance, the $Si_2Al_4O_4N_4:Eu^{2+}$ (β-sialon) fluorescent substance, and the $CaAlSiN_3:Eu^{2+}$ fluorescent substance.

Figure 9:
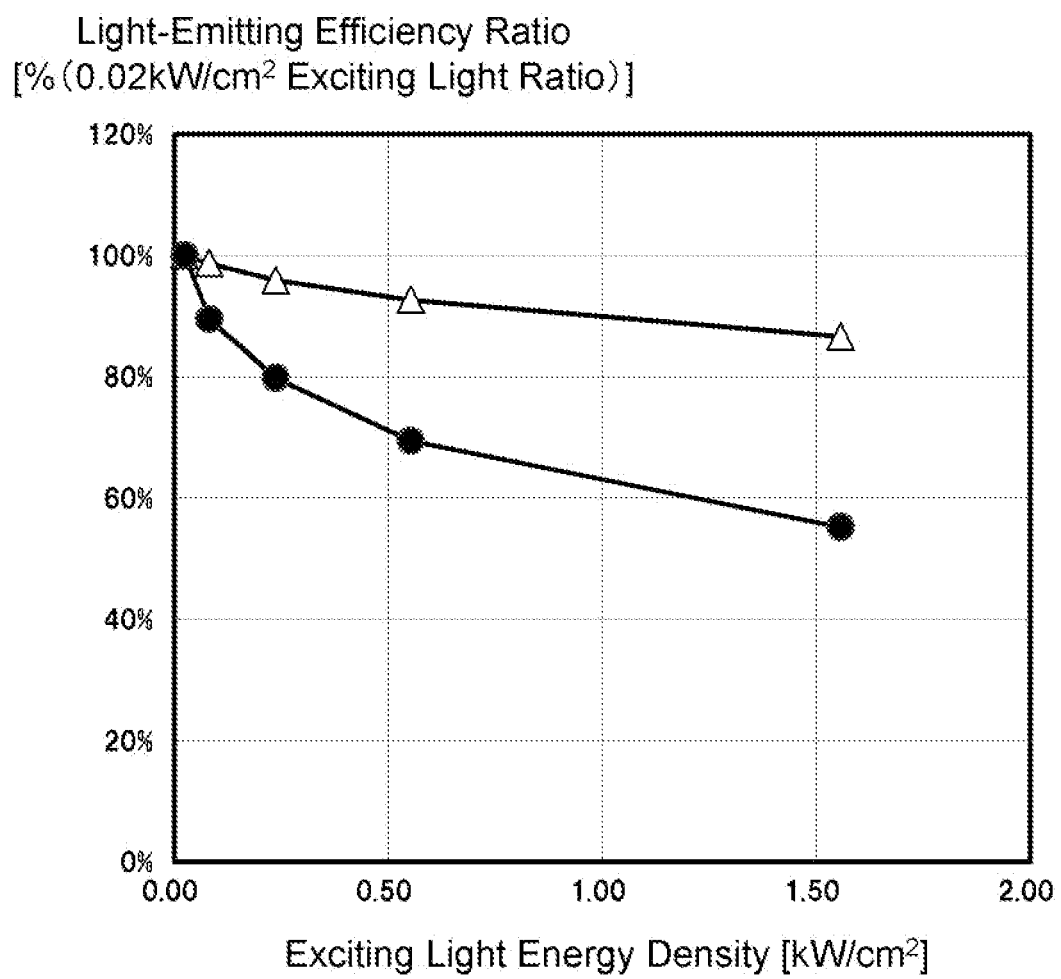
FIG. 9 is a graph showing the exciting light energy density dependency property of the light-emitting efficiency of the light source devices according to the inventive example 3 and the comparative example 3.

While the exciting light energy density incident on the wavelength conversion member 41 was varied by controlling the output of the laser diode, the change of the light-emitting efficiency of the light source devices according to the inventive example 3 and the comparative example 3 was measured. Table 3 shows the result thereof. The values included in Table 3 are relative values each calculated by dividing the measured light-emitting efficiency by the light-emitting efficiency measured when the fluorescent substance was excited at a light energy density of 0.02 kW/cm². FIG. 9 is a plot of the exciting light energy density vs. the light-emitting efficiency ratio stated in Table 3.

TABLE 3

| | Light energy density [kW/cm²] | | | | |
|---|---|---|---|---|---|
| | 0.02 | 0.08 | 0.24 | 0.55 | 1.56 |
| Inventive example 3 | 100% | 99% | 96% | 93% | 87% |
| Comparative example 3 | 100% | 89% | 80% | 69% | 55% |

As is clear from Table 3 and FIG. 9, the decrease of the light-emitting efficiency due to the increase in the exciting light energy density is smaller in the inventive example 3 than in the comparative example 3. Even if the exciting light has an energy density of not less than 0.2 kW/cm², the high light-emitting efficiency is maintained in the light source device according to the inventive example 3.

INDUSTRIAL APPLICABILITY

The light source device according to the present invention can be used for a light source of, for example, a typical illuminating device such as a ceiling light; a special illuminating device such as a spotlight, an illumination for stadiums, or an illumination for studios; an illumination device for vehicles such as a headlamp; a projection device such as a projector or a head-up display; light for endoscopes; an imaging device such as a digital camera, a cellular phone, a smartphone; or a liquid crystal display device such as a monitor for personal computers, a notebook personal computer, a television, a personal digital assistant (PDA), a smartphone, a tablet personal computer, or a cellar phone.

REFERENTIAL SIGNS LIST 20, 40 light source device
21, 41 wavelength conversion member
12 semiconductor light-emitting element
22 first fluorescent substances layer
23 second fluorescent substances layer
24 third fluorescent substances layer
25 first fluorescent particle 26 second fluorescent particle
27 third fluorescent particle
28 first binder
29 second binder
30 third binder
19 incident optical system
120 vehicle headlamp
121 wavelength cut filter
122 light-emitting optical system
130 vehicle
131 electric power supply source
132 electric power generator

The invention claimed is:

1. A light source device comprising:
 a semiconductor light-emitting element; and
 a wavelength conversion member for converting a wavelength of a light emitted from the semiconductor light-emitting element into a longer wavelength, wherein:
 the semiconductor light-emitting element has a light-emitting peak wavelength of not less than 380 nanometers and not more than 420 nanometers,
 the light emitted from the semiconductor light-emitting element has a light energy density of not less than 0.2 kW/cm$^2$,
 the wavelength conversion member includes a blue fluorescent substance, a green fluorescent substance, and a red fluorescent substance,
 the blue fluorescent substance includes a $(Sr_{1-x},Ba_x)_3MgSi_2O_8:Eu^{2+}$ ($0 \leq x \leq 1$) fluorescent substance,
 the green fluorescent substance includes a $(Y_{1-y},Gd_y)_3(Al_{1-z},Ga_z)_5O_{12}:Ce^{3+}$ ($0 \leq y < 1$, $0 \leq z < 1$) fluorescent substance, and
 the red fluorescent substance includes at least one selected from the group consisting of a $LiLaW_2O_8:Eu^{3+}$ fluorescent substance, a $Ca_2W_2O_8:Eu^{3+}$ fluorescent substance, and a $LiGdW_2O_8:Eu^{3+}$ fluorescent substance.

2. The light source device according to claim 1, wherein:
 the wavelength conversion member comprises a first fluorescent substance layer and a second fluorescent substance layer,
 the second fluorescent substance layer is interposed between the first fluorescent substance layer and the semiconductor light-emitting element, and
 the second fluorescent substance layer has a longer peak wavelength than the first fluorescent substance layer.

3. The light source device according to claim 1, wherein the wavelength conversion member is formed of a mixture of the blue fluorescent substance, the green fluorescent substance, and the red fluorescent substance.

4. The light source device according to claim 1, wherein the semiconductor light-emitting element is a semiconductor laser.

5. The light source device according to claim 1, further comprising:
 at least one of a lens, a mirror and an optical fiber, disposed between the semiconductor light-emitting element and the wavelength conversion member.

6. The light source device according to claim 1, wherein the light source device produces a white light.

7. The light source device according to claim 1, wherein the light emitted from the semiconductor light-emitting element has a light energy density of not more than 3.5 kW/cm$^2$.

8. The light source device according to claim 1, wherein the wavelength conversion member is formed of a stacking structure of a first fluorescent substance layer containing the blue fluorescent substance, a second fluorescent substance layer containing the green fluorescent substance, and a third fluorescent substance layer containing the red fluorescent substance.

9. The light source device according to claim 8, wherein:
 the third fluorescent substance layer is interposed between the semiconductor light-emitting element and the second fluorescent substance layer, and
 the second fluorescent substance layer is interposed between the first fluorescent substance layer and the third fluorescent substance layer.

10. An illumination device comprising the light source device according to claim 1.

11. The illumination device according to claim 10, wherein the illumination device is a vehicle illumination device.

12. A vehicle comprising the vehicle illumination device according to claim 11.

* * * * *